United States Patent
Noor et al.

(10) Patent No.: US 10,230,252 B2
(45) Date of Patent: Mar. 12, 2019

(54) METHOD AND SYSTEM FOR CHARGING A BATTERY BASED ON AN IDENTIFIER OF A POWER CABLE

(71) Applicant: SYMBOL TECHNOLOGIES, LLC, Lincolnshire, IL (US)

(72) Inventors: Gad Noor, Givatayim (IL); Michael A Ramputi, Ronkonkoma, NY (US); Jonathan Stok, Kfar Saba (IL); Doron Yogev, Givat Ze'Ev (IL); Yoseff Mordechi Zlotnick, Petach Tikva (IL); Michael Robustelli, Kings Park, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 240 days.

(21) Appl. No.: 14/609,476

(22) Filed: Jan. 30, 2015

(65) Prior Publication Data

US 2016/0226280 A1    Aug. 4, 2016

(51) Int. Cl.
*H02J 50/80*    (2016.01)
*H02J 7/00*    (2006.01)
*G01R 31/36*    (2019.01)

(52) U.S. Cl.
CPC ........ *H02J 7/0052* (2013.01); *G01R 31/3606* (2013.01); *G01R 31/3648* (2013.01); *H02J 7/0004* (2013.01); *H02J 7/0042* (2013.01)

(58) Field of Classification Search
CPC .................................................... H02J 7/0052
USPC ........................................................ 320/107
See application file for complete search history.

(56) References Cited

U.S. PATENT DOCUMENTS

| 7,072,808 | B2 | 4/2006 | Wesby |
| 7,086,081 | B2 | 8/2006 | Martinez et al. |
| 7,151,769 | B2 * | 12/2006 | Stanforth ................ H04L 45/02 370/311 |

(Continued)

FOREIGN PATENT DOCUMENTS

| EP | 2654171 A1 | 10/2013 |
| WO | 2006034563 | 4/2006 |

(Continued)

OTHER PUBLICATIONS

Gruenwald et al., "A Power-Aware Technique to Manage Real-Time Database Transactions in Mobile Ad-Hoc Networks", Database and Expert Systems Applications, 2001, Proceedings 12th International Workshop on Sep. 3, 2001-Sep. 7, 2001, pp. 570-574.

(Continued)

*Primary Examiner* — Drew A Dunn
*Assistant Examiner* — Jerry D Robbins

(57) ABSTRACT

A method and system for charging a battery is provided. A group charging policy specifying a conditional charging behavior for charging a battery of a computing device is stored in a memory of the computing device. The computing device is coupled to a power source. Battery status data is received, via a communications interface of the device, for each of at least one other computing device coupled to the power source. A power draw rate for charging the battery of the computing device is throttled according to the group charging policy and the battery status data of the computing device and the at least one other computing device.

22 Claims, 8 Drawing Sheets

(56) References Cited

U.S. PATENT DOCUMENTS

| | | | |
|---|---|---|---|
| 7,697,963 B1 | 4/2010 | Pomery | |
| 7,720,026 B2 | 5/2010 | Chen et al. | |
| 7,805,263 B2 | 9/2010 | Mack | |
| 8,072,392 B2 | 12/2011 | Lection | |
| 8,102,262 B2 * | 1/2012 | Irmscher | A47F 3/002 |
| | | | 340/568.1 |
| 8,188,709 B2 | 5/2012 | Onishi et al. | |
| 8,314,699 B2 | 11/2012 | Imscher et al. | |
| 8,320,302 B2 | 11/2012 | Richeson | |
| 8,510,737 B2 | 8/2013 | Kunjithapatham et al. | |
| 8,553,408 B2 | 10/2013 | Supran et al. | |
| 8,558,694 B2 | 10/2013 | Brandt et al. | |
| 8,692,511 B2 | 4/2014 | Clouser | |
| 9,026,710 B2 | 5/2015 | Goodman et al. | |
| 9,094,495 B1 * | 7/2015 | Robustelli | H02J 7/0004 |
| 2006/0067249 A1 | 3/2006 | Poustchi et al. | |
| 2009/0261656 A1 | 10/2009 | Coonan et al. | |
| 2010/0295503 A1 * | 11/2010 | Bourilkov | H02J 7/0006 |
| | | | 320/106 |
| 2011/0285345 A1 | 11/2011 | Kawai et al. | |
| 2011/0320828 A1 * | 12/2011 | Boss | G06F 1/3209 |
| | | | 713/300 |
| 2012/0035778 A1 | 2/2012 | Chew | |
| 2012/0115503 A1 | 5/2012 | Lynch et al. | |
| 2012/0136942 A1 | 5/2012 | Amidon et al. | |
| 2011/2015389 | 6/2012 | Makhija et al. | |
| 2012/0153892 A1 | 6/2012 | Makhija et al. | |
| 2012/0153899 A1 * | 6/2012 | Marschalkowski | H02J 7/0018 |
| | | | 320/118 |
| 2012/0296450 A1 * | 11/2012 | Alley | H04L 41/0809 |
| | | | 700/79 |
| 2012/0306438 A1 * | 12/2012 | Howard | A42B 3/046 |
| | | | 320/107 |
| 2013/0002455 A1 | 1/2013 | Koehrsen et al. | |
| 2013/0002458 A1 | 1/2013 | Koehrsen et al. | |
| 2013/0043827 A1 * | 2/2013 | Weinstein | H02J 7/0042 |
| | | | 320/103 |
| 2013/0046197 A1 * | 2/2013 | Dlugos, Jr. | G06F 19/3406 |
| | | | 600/529 |
| 2013/0173765 A1 | 7/2013 | Korbecki | |
| 2013/0185373 A1 | 7/2013 | Vandwalle et al. | |
| 2013/0187603 A1 | 7/2013 | Kadie | |
| 2013/0187604 A1 | 7/2013 | Kadie | |
| 2013/0223341 A1 | 8/2013 | Kim et al. | |
| 2013/0307466 A1 | 11/2013 | Frisch et al. | |
| 2014/0145673 A1 * | 5/2014 | Heilbrun | H02J 7/0042 |
| | | | 320/107 |
| 2014/0191033 A1 * | 7/2014 | Wojcik | G06K 7/082 |
| | | | 235/449 |
| 2015/0011160 A1 * | 1/2015 | Jurgovan | H04B 5/0031 |
| | | | 455/41.1 |
| 2015/0021995 A1 * | 1/2015 | Chang | G06F 1/266 |
| | | | 307/31 |
| 2015/0056920 A1 * | 2/2015 | Huttunen | H04B 7/26 |
| | | | 455/41.2 |
| 2015/0380971 A1 * | 12/2015 | Priev | H02J 7/025 |
| | | | 320/108 |
| 2016/0111905 A1 * | 4/2016 | Duncan | H02J 7/0047 |
| | | | 320/107 |
| 2016/0140010 A1 * | 5/2016 | Herb | H02J 7/0052 |
| | | | 320/107 |

FOREIGN PATENT DOCUMENTS

| | | |
|---|---|---|
| WO | 2012027844 | 3/2012 |
| WO | 2014107465 A1 | 7/2014 |

OTHER PUBLICATIONS

Choi et al., "Group based Resource Selection Algorithm supporting/Fault-tolerance in Mobile Grid", Semantics Knowledge and Grid, Third International Conference on Oct. 29-31, 2007, pp. 426-429.

* cited by examiner

METHOD AND SYSTEM FOR CHARGING A BATTERY BASED ON AN IDENTIFIER OF A POWER CABLE

BACKGROUND OF THE INVENTION

The batteries in sets of computing devices in some environments are generally charged using a limited power source. This is often the case where high availability is desirable for computing devices. Examples of computing devices in such high-availability environments include handheld computing devices with data acquisition modules used by courier employees to track and register movement of packages throughout a delivery network, and by warehouse employees to track and register inventory and movement of products in a warehouse.

In some cases, one or more multi-slot charging cradles are used to charge the batteries in a group of computing devices. Hereinafter, when batteries are being charged while they are in computing devices, it may be said that the computing devices are being charged. The multi-slot charging cradles are connected to one or more power sources. The computing devices include batteries and hardware and software for managing the charging of the batteries and the provisioning of power from the batteries to other components of the computing device. In a generally default configuration, each computing device is configured to draw power at a maximum rate to charge its battery, and the limited current for each power source is generally equally divided amongst computing devices being charged, causing the batteries of the computing devices to charge roughly at an equal rate. This can be less desirable in some scenarios.

Accordingly, there is a need for a novel method and system for charging a battery.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
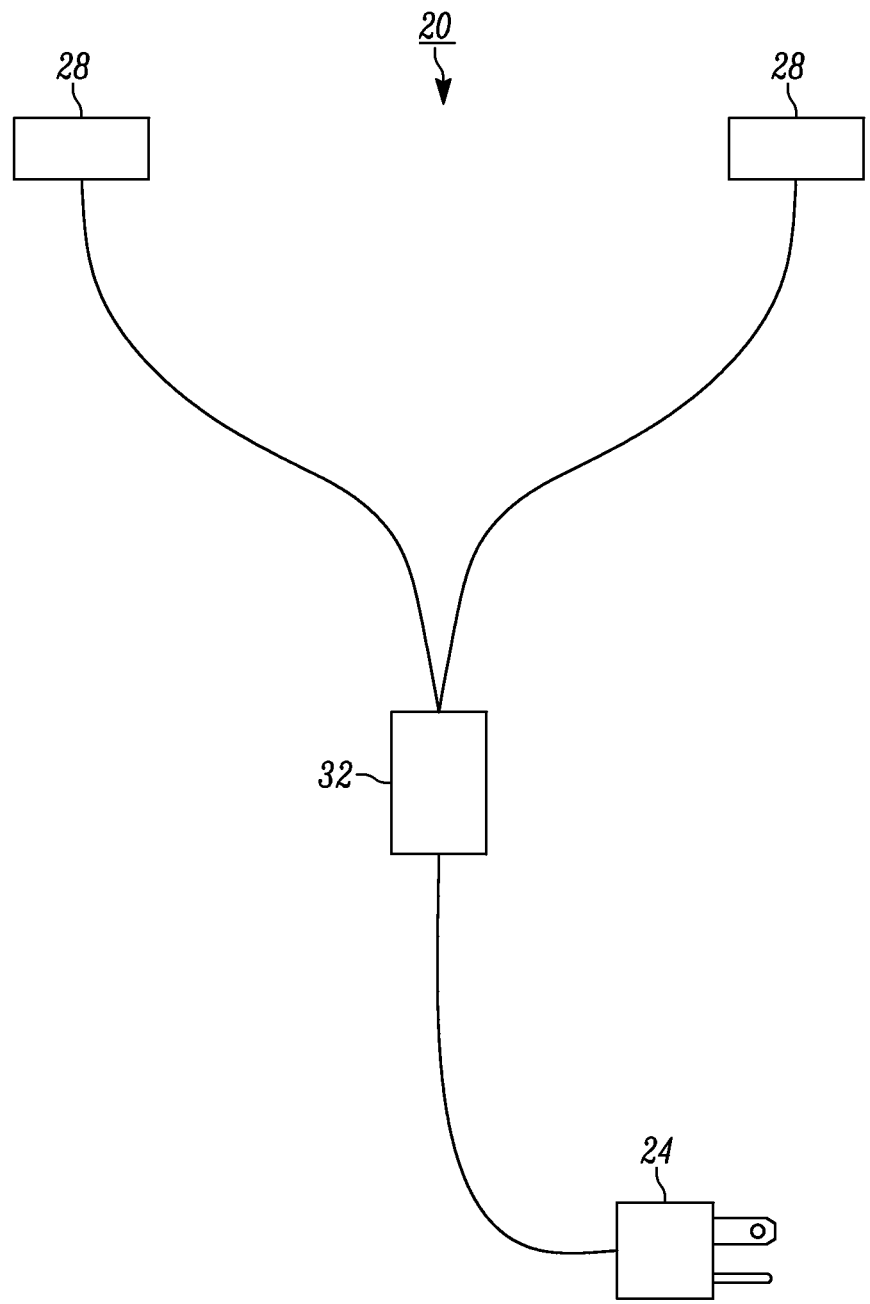
FIG. 1 is a block diagram of a power cable in accordance with an embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

A method and system for charging a battery is provided. A group charging policy specifying a conditional charging behavior for charging a battery of the computing device is stored in a memory of the computing device. The computing device is coupled to a power source. Battery status data is received for each of at least one other computing device coupled to the power source. A power draw rate for charging the battery of the computing device is throttled according to the group charging policy and the battery status data of the computing device and the at least one other computing device.

FIG. 1 is a block diagram of a power cable 20 in accordance with an embodiment. The power cable 20 is shown having a plug 24 for connecting to a limited power source. The plug 24 can take the form of a standard male electrical plug. This form can be varied to connect to a power outlet of a specific region and/or power source. Alternatively, the plug 24 can be a non-standard plug designed to connect to a particular power source; e.g., a format proprietary to a particular manufacturer or manufacturers.

The power cable 20 includes a set of one or more branches that are terminated with terminal connectors 28. The terminal connectors 28 are similar to standard cradle power adapter connectors with additional contacts.

Further, the power cable 20 includes a memory 32 storing an identifier, referred to as a cable ID. The memory can be any suitable type for storing the identifier during the operation of the power cable 20.

The additional contacts on the terminal connectors 28 enable communication with the memory 32 to retrieve the identifier stored by the memory 32.

Figure 2:
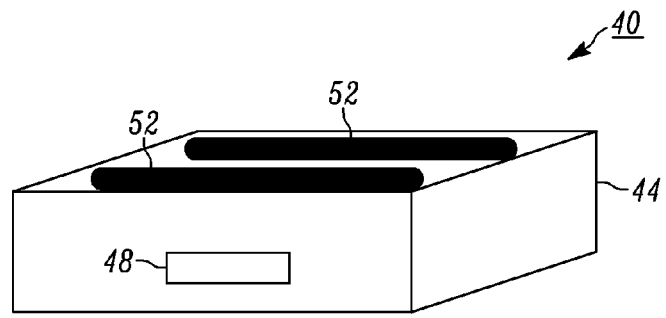
FIG. 2 is a block diagram of a charging cradle in accordance with the embodiment for use with the power cable of FIG. 1.

FIG. 2 is a block diagram of a charging cradle 40 in accordance with an embodiment for use with the power cable 20 of FIG. 1. The charging cradle 40 has a base 44 with a power adapter interface 48 for connecting to a cradle power adapter connector, such as, for example, terminal connectors 28. In addition, the charging cradle 40 has a pair of charging slots 52 for receiving computing devices to be charged. The charging slots 52 include a device interface for connecting to a charging interface of a computing device.

Figure 3:
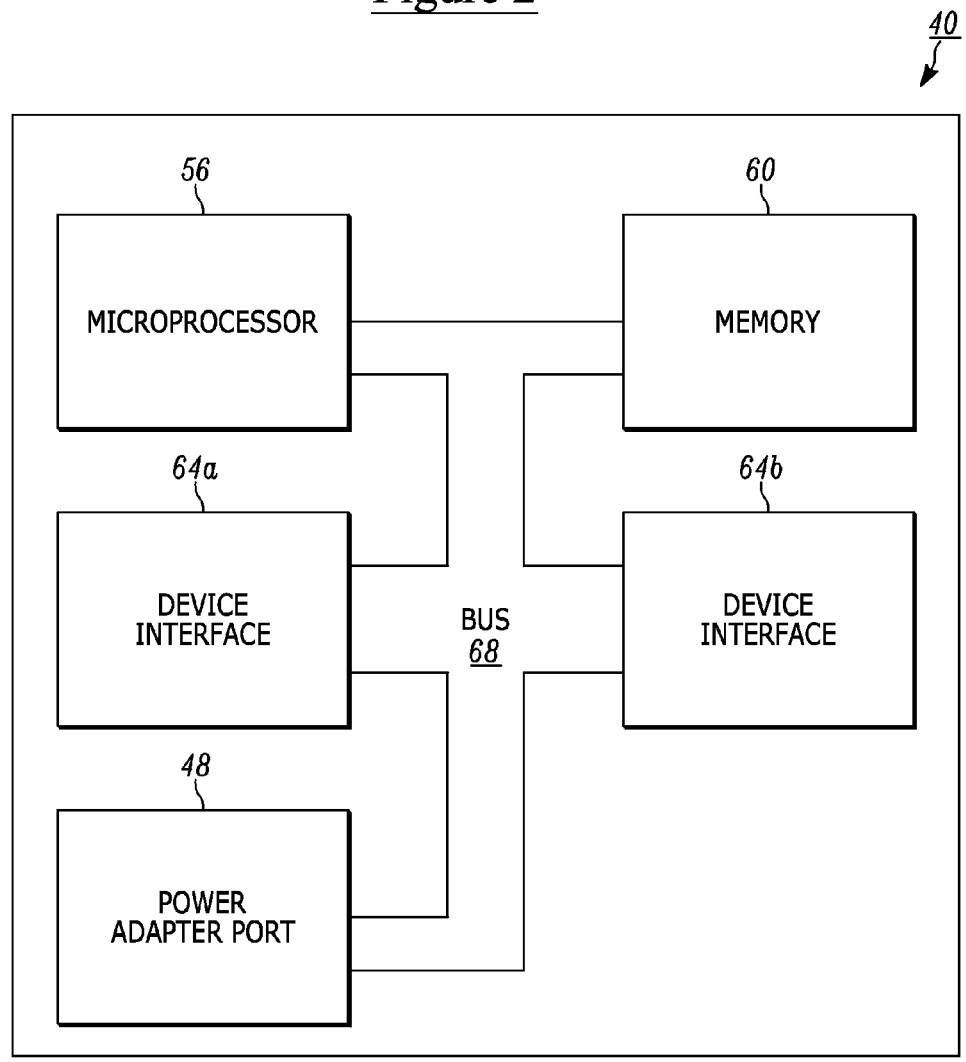
FIG. 3 is a block diagram of various components of the charging cradle of FIG. 2.

FIG. 3 is a block diagram of various components of the charging cradle 40 of FIG. 2. As shown, the charging cradle 40 includes a microprocessor 56, a memory 60, a first device interface 64a, a second device interface 64b, the power adapter interface 48, and a bus 68 for enabling the microprocessor 56 to communicate with the other components.

The microprocessor 56 can be any suitable processor for communicating with the power cable 20 connected to the power adapter interface 48, and with computing devices coupled to the device interfaces 64a, 64b. The memory 60 can be any suitable memory for storing instructions executed by the microprocessor 56 and for storing a cable ID. The device interfaces 64a, 64b reside in the charging slots 52 of the charging cradle 40 and enable charging of connected computing devices, as well as communication of information with the computing devices. The power adapter interface 48 receives power from a connected power source and includes one or more additional contacts for communicating information with other components of the power cable.

The microprocessor 56 is configured to communicate with the memory 32 of the power cable 20 via contacts of the power adapter interface 48 interfacing with the additional contacts of the power cable 20, and for communications with computing devices coupled to the device interfaces 64a, 64b.

Figure 4:
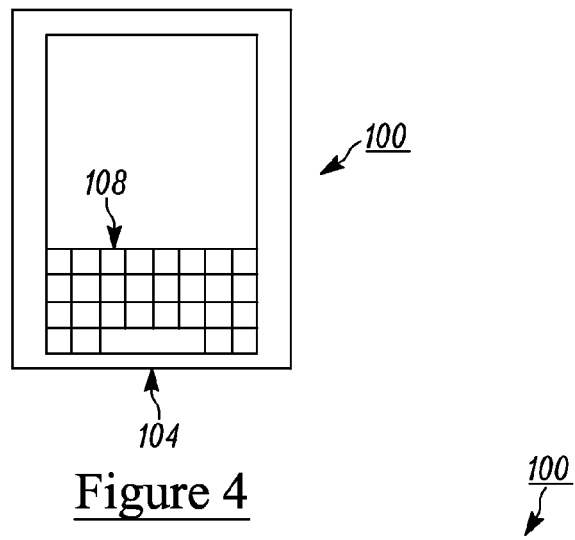
FIG. 4 is a front view of a computing device in accordance with the embodiment for use with the charging cradle of FIG. 2.

FIG. 4 is a front view of a computing device 100 for use with the charging cradle of FIGS. 2 and 3. The computing device 100 can be any kind of computing device that can store a group charging policy, communicate with other computing devices to determine battery status data thereof, and manage the charging of a battery in accordance with the group charging policy and the battery status data. Examples of computing devices include wireless barcode scanners used for controlling inventory in a warehouse, and wireless mobile point-of-sale terminals for use in a retail environment. In the particular illustrated example, the computing device 100 is a wireless barcode scanner.

The computing device 100 includes a charging interface 104 for charging a battery thereof, provisioning power from the battery, and communicating with a charging cradle 40 to which it is connected. In addition, the computing device 100 includes a user interface 108 for enabling a user to interact with the computing device 100 and its configuration. The user interface 108 can include, for example, a keypad and other buttons, a touchscreen.

Figure 5:
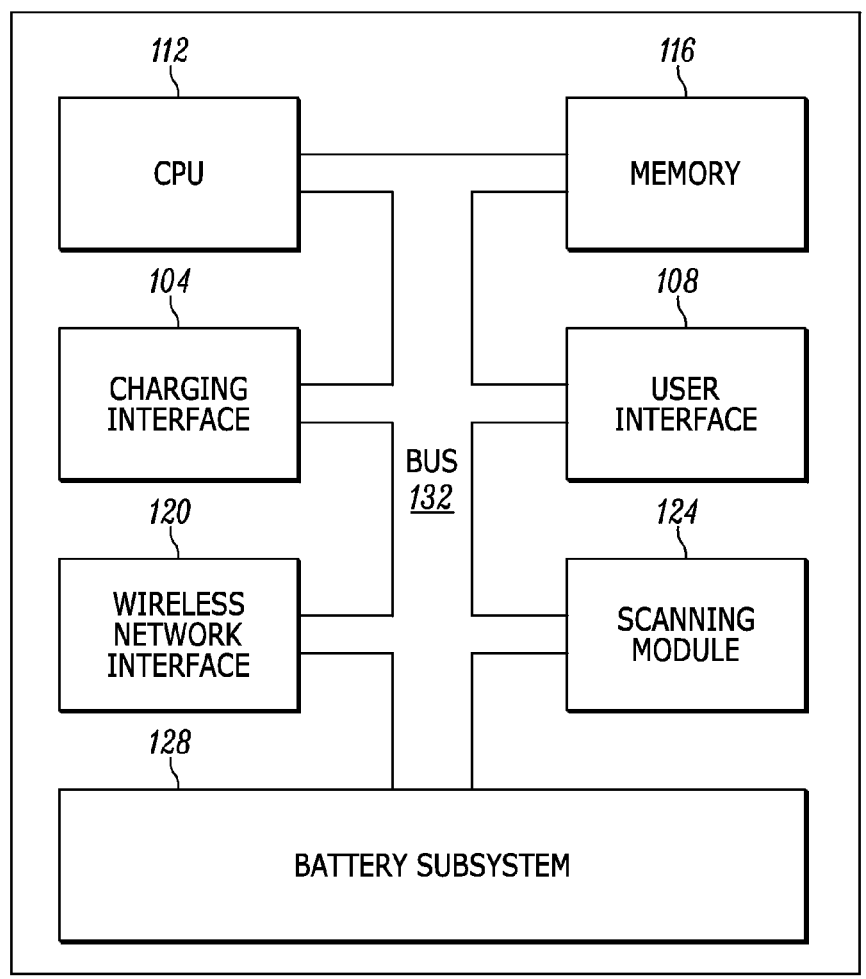
FIG. 5 is a block diagram of various components of the computing device of FIG. 4.

FIG. 5 is a block diagram of various components of the computing device 100 of FIG. 4. The computing device 100 includes the charging interface 104, the user interface 108, a central processing unit ("CPU") 112, a memory 116, a wireless networking interface 120, a scanning module 124, a battery subsystem 128, and a bus 132 enabling the CPU 112 to communicate and manage the other components. The CPU 112 is configured to execute an operating system for controlling the various hardware and software elements of the computing device 100. In addition, the CPU 112 is configured to manage the charging and discharging of the battery subsystem 128. The memory 116 stores the operating system and applications and related data.

In addition, the memory 116 stores a group charging policy that determines the charging behavior of the computing device 100. In particular, the computing device 100 uses the group charging policy to determine the power draw rate of the computing device 100 from the power source via the charging interface 104 conditional on the battery status data for the battery subsystem 128 of the computing device 100 as well as that of other computing devices 100 coupled to the same power source.

The wireless network interface 120 enables wireless communication via WiFi. The scanning module 124 is operable to capture data from bar codes.

The battery subsystem 128 includes a microprocessor for controlling the charging and discharging of a battery of the battery subsystem 128, and a memory for storing battery status data, such as the battery charge state, the periods during which the battery was being charged or employed to provide power, the number of number of times the battery was charged, the health of the battery, the minimum and maximum charge values of the battery, the configuration and version information for the battery subsystem 128, etc. The battery of the battery subsystem 128 can be a single battery or an array of batteries managed by the battery subsystem 128. The battery status data from the battery subsystem can be read and used by the computing device 100 in addition to any separately-generated battery status data that it stores.

Figure 6:
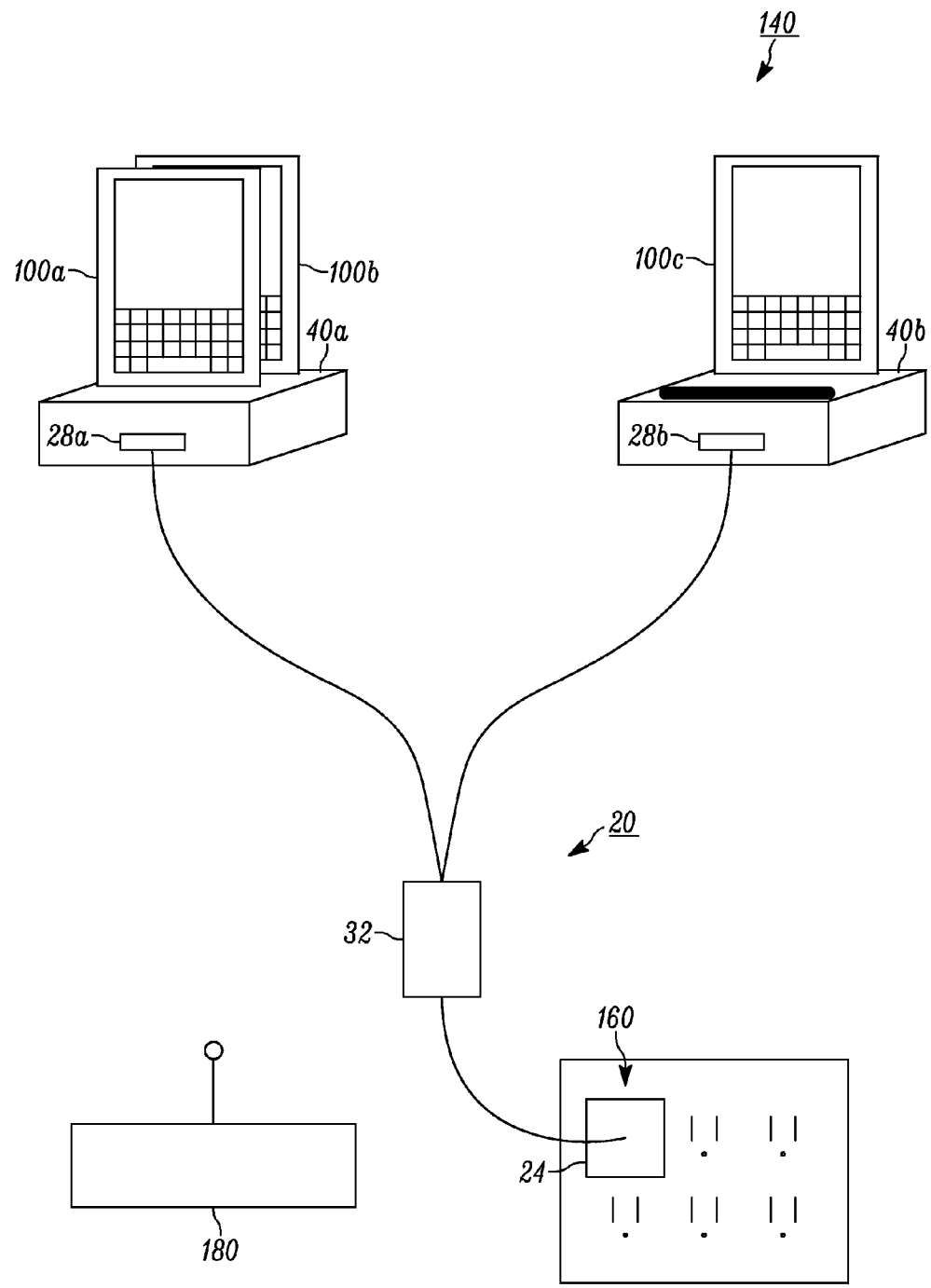
FIG. 6 is a block diagram of a system for charging batteries in accordance with the embodiment illustrated in FIGS. 1-5.

FIG. 6 is a block diagram of a system 140 for charging a set of computing devices 100 in accordance with the embodiment illustrated in FIGS. 1-5. As shown, the terminal connectors 28a, 28b of the power cable 20 are connected to the power adapter interfaces 48 of a pair of charging cradles 40a, 40b.

The plug 24 of the power cable 20 is connected to a power source 160. The power source 160 has a limited current that it can provide, as voltage is generally fixed. The power source 160 can be connected to via a standard outlet or a custom outlet. Further, the power source 160 can be connected to a power grid, a power generator, etc.

A pair of computing devices 100a, 100b are shown coupled to the first charging cradle 40a, and a third computing device 100c is shown coupled to the second charging cradle 40b. In particular, the charging interfaces 104 of the computing devices 100a, 100b, 100c are in communication with the device interfaces 64 of the charging cradles 40a, 40b. The computing devices 100a, 100b, 100c communicate with each other via a wireless infrastructure network provided by a wireless router 180.

Figure 7:
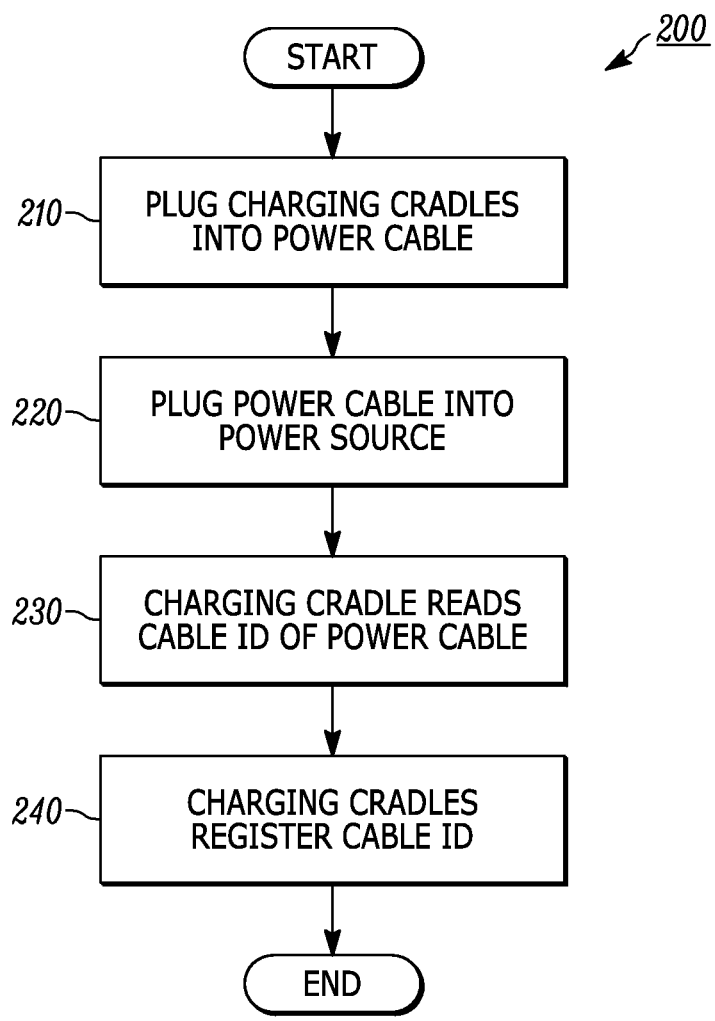
FIG. 7 is a flowchart of the method of initializing the system of FIG. 6.

Referring now to FIGS. 6 and 7, a flowchart of the general method 200 of initializing the system of FIG. 6 is shown. One or more charging cradles 40 are connected to the terminal connectors 28 of the power cable 20 (210). The power cable 20 is then plugged into the power source 160 (220). The charging cradles 40 then read the cable ID from the power cable 20 (230). The charging cradles 40 communicate with the memory 32 of the power cable 20 via the additional contacts of the terminal connectors 28 to retrieve the cable ID stored in the memory 32. The charging cradles 40 then register the cable ID by storing it in memory 60 (240). Upon registering the cable ID of the power cable 20 associated with the power source 160, the method 200 of initializing the system 140 is complete.

Figure 8:
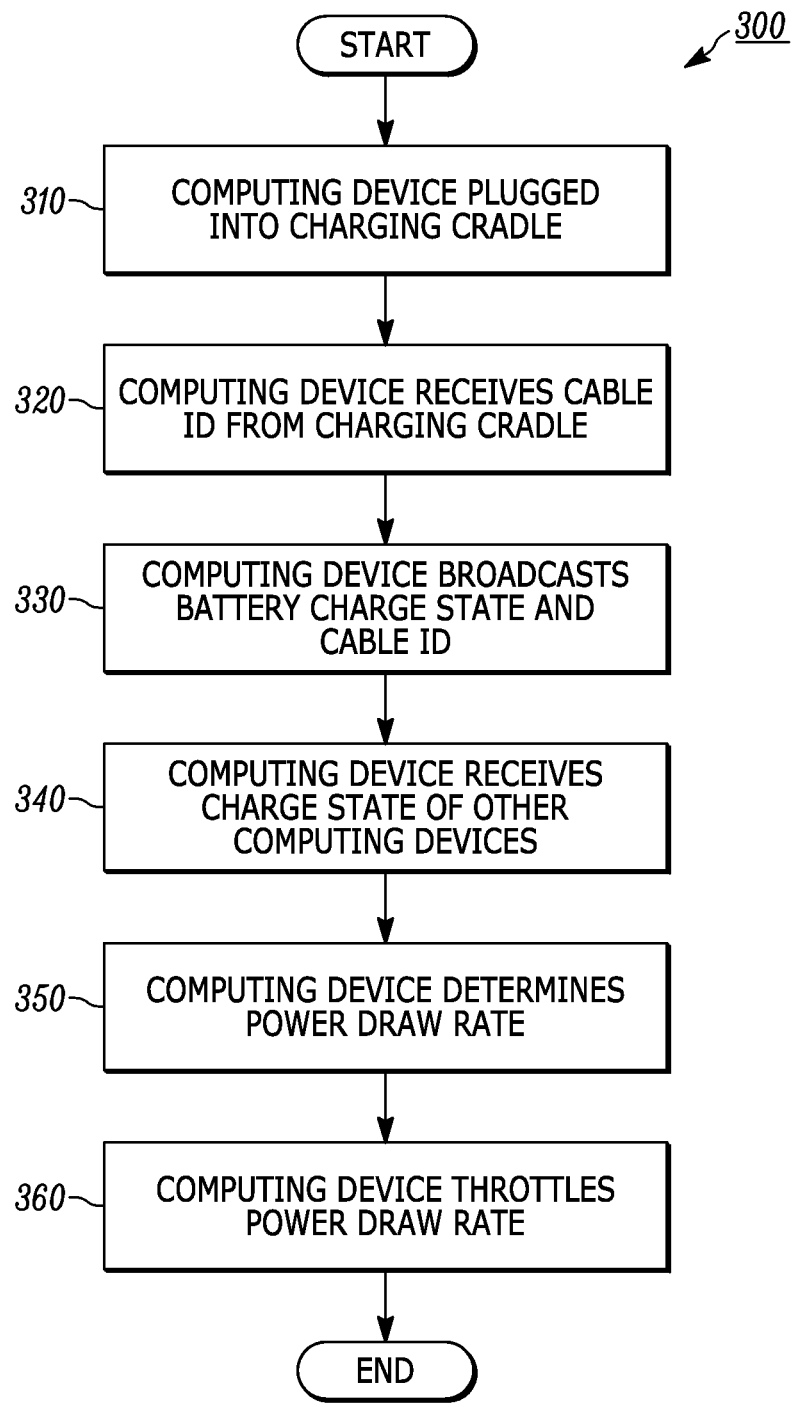
FIG. 8 is a flowchart of the general method of charging a battery employed by the system of FIG. 6.

FIG. 8 shows a flowchart of the general method 300 of charging a battery of a computing device 100 employed by the system 140 of FIG. 6. The method 300 commences with the plugging of a computing device 100 into a charging cradle 40 (310). The charging interface 104 of the computing device 100 is aligned with and then connected to a device interface 64 of the charging cradle 40 as the computing device 100 is placed into a charging slot 52 of the charging cradle 40. Next, the computing device 100 receives the cable ID from the charging cradle 40 (320). Upon detecting that the computing device 100 is connected to a device interface 64, the microprocessor 56 of the charging cradle 40 transmits the cable ID stored in memory 60 during initialization of the system 140 to the computing device 100 via the device interface 64.

Upon receipt of the cable ID, the computing device 100 broadcasts the charge state of its battery as provided by the battery subsystem 128 (330). In particular, the computing device 100, upon receiving the cable ID from the charging cradle 40, commences broadcasting the received cable ID and its battery charge state via the wireless network interface 120. The broadcast communications include a network identifier, such as an IP address, of the wireless network interface 120 of the computing device 100. The cable ID and the battery charge state of the computing device 100 are received by other computing devices 100 connected to the same power source 160. By transmitting the cable ID, the computing devices 100 connected to the power source 160 can form a charging network The computing device 100 then receives the battery charge state of other computing devices 100 (340). As other computing devices 100 are connected to charging cradles 40 coupled to the power cable 20, they commence broadcasting the cable ID and their battery charge state via the wireless network. These messages are received by the computing device 100 via the wireless network interface 120. The cable ID received with messages from other computing devices 100 enables the CPU 112 of the computing device 100 to identify which messages were generated by computing devices 100 on the same power source. Further, the network identifier accompanying broadcast messages including cable IDs and battery charge states enables the CPU 112 to identify unique computing devices 100 and their battery charge states.

The computing device 100 then determines its power draw rate (350). In particular, the CPU 112 of the computing device 100 determines its power draw rate according to the group charging policy and the battery charge state of the computing device 100 and of other computing devices 100 associated with the cable ID.

Multi-slot cradles have a restricted power level they can provide as a result of being connected to a single limited power source. Usually, this power is equally divided between all of the battery subsystems in a charging cradle. Maximal charging power for each connected computing device 100 is equal to the power source for the charging cradle 40 divided by the number of computing devices 100 hosted simultaneously.

The computing devices 100 can dynamically throttle the power draw rate based on their group charging policy. Examples of group charging policies include:
- prioritized charging for one or more computing devices 100 with the highest battery charge state so that at least one computing device 100 (i.e., its battery) can be approximately fully charged more rapidly than otherwise possible;
- prioritized charging for one or more computing devices 100 with the lowest battery charge state to, for example, complete the charging of each computing device 100 in the group around the same time; and
- prioritized charging based on the rate at which each computing device 100 is charging relative to its power draw rate (that is, identify computing devices 10 that are not charging as expected and reduce their power draw rate to allow for computing devices 100 with more healthy batteries to be charged first).

If the group charging policy with which a computing device 100 is configured specifies to charge a single computing device as quickly as possible, then the computing device 100 with the highest battery charge state will throttle its power draw rate as high as possible. The remaining computing devices 100 in the group (i.e., on the same power source as identified by the cable ID) will reduce their power draw rate such that the limited power of the common power source will not be exceeded. As each computing device can throttle its power draw rate to a level that is higher than the maximum charging cradle power divided by the number of charging slots that share the power restriction, the charge rate for a few computing devices 100 can be boosted on the expense of the others. This is achieved via the group charging policy.

Upon determining a power draw rate at 350, the computing device 100 throttles its power draw rate (360).

After the computing device 100 throttles its power draw rate, the method 300 of charging a battery ends.

As will be appreciated, parts of the method 300 are reiterated repeatedly over time. Computing devices 100 in the system 140 periodically re-determine their power draw rate based on their battery charge state and the battery charge states of other computing devices 100 connected to the system 140. A computing device 100 deems another computing device 100 to be connected if a broadcast message was received from it within a pre-determined time period, such as thirty seconds. If a broadcast message was last received from another computing device more than 30 seconds ago, the particular computing device 100 is deemed to have disconnected from the system 140 and is not considered in the determination of the power draw rate. As other computing devices 100 connect to the system 140, they broadcast their cable ID and their battery charge state like other computing devices 100 that have been connected to the system 140 for a longer period of time. Depending on the group charging policy, other computing devices 100 in the system 140 may significantly adjust their throttling of their power draw rate in response to the new computing device 100 being taken into consideration.

Figure 9:
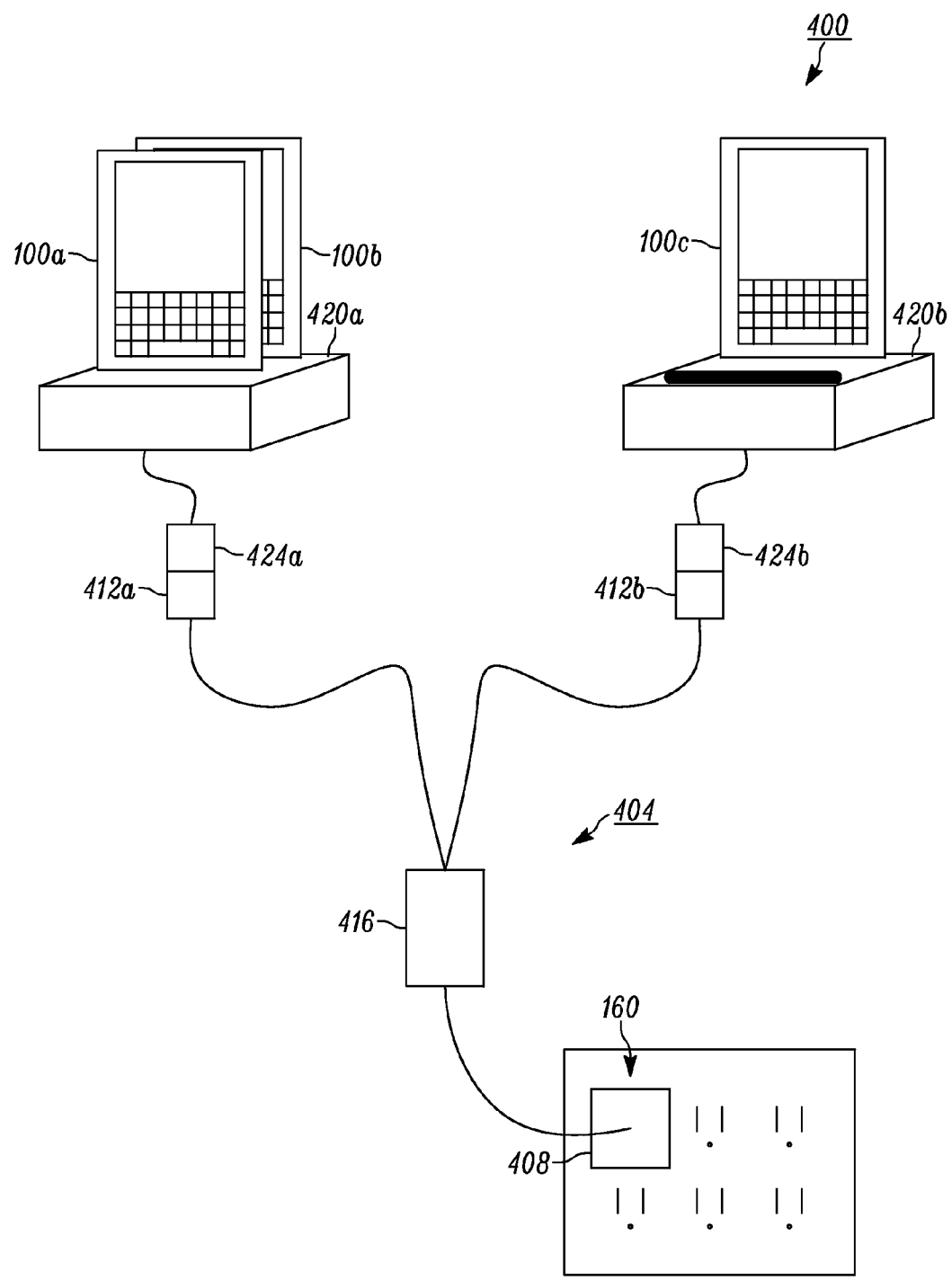
FIG. 9 is a block diagram of a system for charging batteries in accordance with an alternative embodiment.

FIG. 9 shows a system 400 for charging batteries in accordance with an alternative embodiment. The system 400 includes a power cable 404 that has a plug 408 for connecting to the power source 160. A pair of outlet connectors 412a, 412b matches the power outlet of power source 160. An identification module 416 includes an RFID tag storing a cable ID. A pair of charging cradles 420a, 420b is shown connected to the outlet connectors 412a, 412b respectively via standard cradle charging cables 424a and 424b respectively. Each of charging cradles 420a, 420b includes an RFID tag reader for scanning and reading the cable ID from the identification module 416 of the power cable 404. As will be appreciated, the system 400 generally operates in a similar manner to the system 140 of FIG. 6 except that acquisition of the cable ID is performed via RF communications instead of via cable communications. In addition, the system 400 enables the power cable 404 to be more generic.

Figure 10:
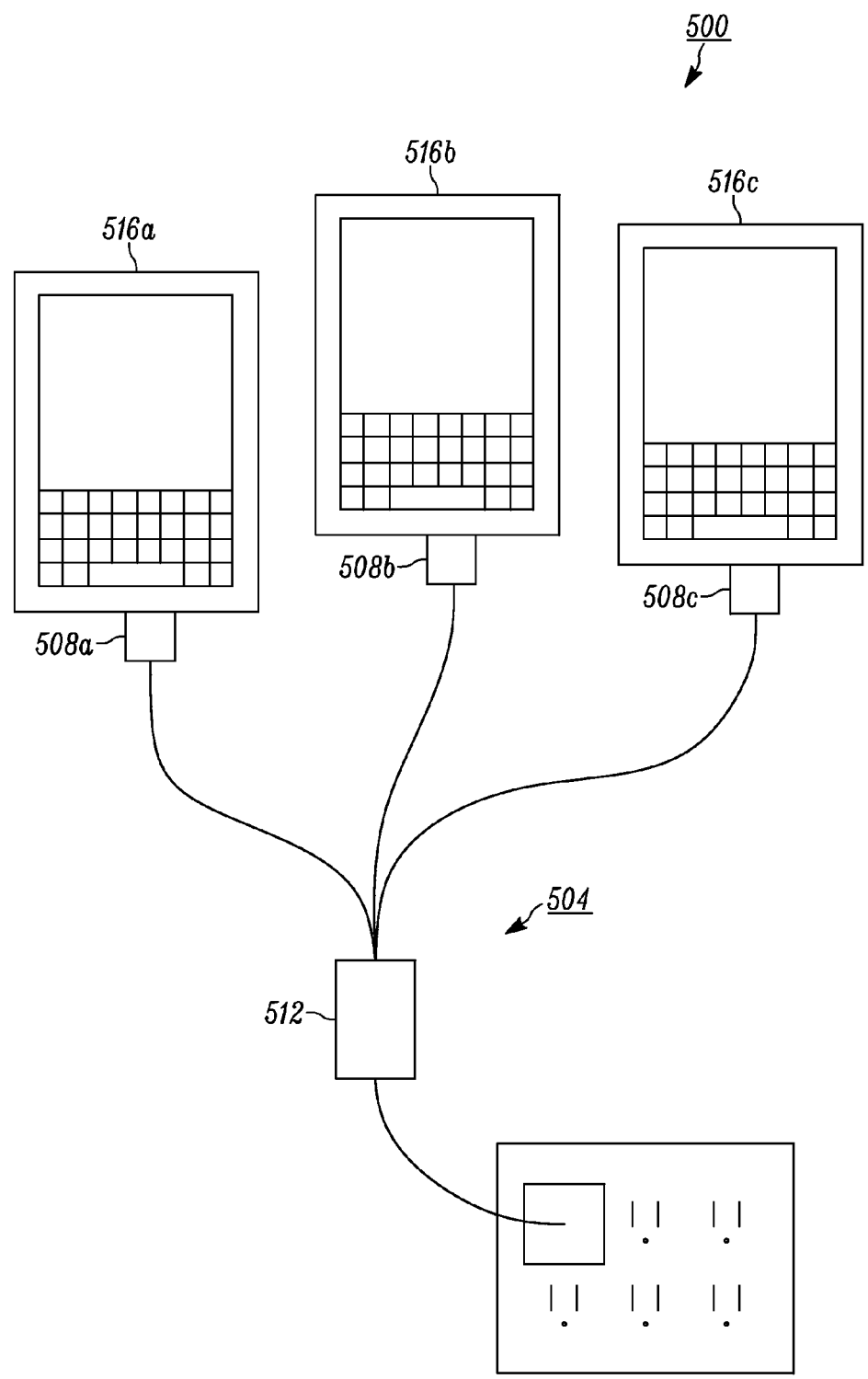
FIG. 10 is a block diagram of a system for charging batteries in accordance with another alternative embodiment.

FIG. 10 shows another system 500 for charging batteries in accordance with yet another alternative embodiment. As shown, a power cable 504 includes a set of branches terminated at charging connectors 508a, 508b, 508c. A memory 512 similar to memory 32 of cable 20 stores a cable ID. The form of the charging connectors 508a, 508b, 508c is particular to a type of computing device. A set of computing devices 516a, 516b, 516c is connected to the charging connectors 508a, 508b, 508c. Each of the computing devices 516a, 516b, 516c retrieves the cable ID from the memory 512 via the charging connectors 508a, 508b, 508c and stores it in a memory of the computing devices 516a, 516b, 516c. Subsequently, each computing device 516a, 516b, 516c broadcasts the cable ID (representative of the power source) and the battery charge state for its battery via wireless network communications to the other computing devices.

In a further alternative embodiment, where charging cradles are used to charge batteries, the charging cradles drawing power from the same power source can be manually configured with an identifier associated with the power source so that the power cable need not provide an identifier. The computing devices can also be configured with a group identifier.

Communications between computing devices connected to a single power source can be conducted over power line communications either via the computing devices or the cradles. Alternatively, infrared, audio, other wireless communications standards such as WWAN, Bluetooth, ad-hoc WiFi, etc., or any other suitable means for communications can be used between computing devices.

In another alternative embodiment, the computing devices being charged in a single charging cradle connected to a power source can communicate their battery charge state via the charging cradle to other computing devices connected to the charging cradle.

Using the systems described herein, each computing device can throttle its charge current to a level that is higher than the limited power source provides divided by the number of computing devices sharing the power source. This allows boosting of the charge rate for some computing devices at the expense of the others, all managed by the computing devices themselves without central server management or management by the charging cradles.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The power cable can include one or more branches for connecting directly or indirectly to battery subsystems.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of charging a battery, comprising:
storing, in a memory of a computing device, a group charging policy specifying a conditional charging behavior for charging a battery of the computing device;
coupling the computing device to a power source;
receiving, via a communications interface of the computing device, battery status data from at least one other computing device;
receiving, from the at least one other computing device, an identifier of a power cable coupling the power source to the computing device;

identifying the at least one other computing device as being coupled to the power source based on the received identifier of the power cable;

grouping the computing device and the at least one other computing device into a charging group based on the received identifier of the power cable coupling the power source to the computing device and the at least one other computing device; and throttling a power draw rate for charging the battery of the computing device according to the group charging policy and battery status data of the computing device and the at least one other computing device identified as being coupled to the power source in the charging group.

2. The method of claim 1, wherein the battery status data in the charging group comprises a respective battery charge state of the computing device and the at least one other computing device.

3. The method of claim 1, further comprising:
receiving the identifier from a memory of the power cable associated with the power source.

4. The method of claim 1, wherein the coupling comprises:
connecting the computing device to a charging cradle that is connected to the power source.

5. The method of claim 4, further comprising:
receiving the identifier from the charging cradle.

6. The method of claim 1, further comprising:
communicating the battery status data of the computing device with the identifier to the at least one other computing device.

7. The method of claim 5, further comprising:
communicating the battery status data of the computing device with the identifier to the at least one other computing device.

8. The method of claim 1, wherein the communications interface comprises a wireless networking interface.

9. The method of claim 1, wherein the throttling comprises:
reducing the power draw rate for charging the battery of the computing device.

10. The method of claim 1, wherein the throttling comprises:
maximizing the power draw rate for charging the battery of the computing device.

11. A system for charging a battery, comprising:
a computing device comprising:
a battery;
a first memory storing a group charging policy specifying a conditional charging behavior for charging the battery;
a charging interface configured to couple the computing device to a power source;
a communications interface configured to receive, from at least one other computing device, an identifier of a power cable that couples the power source to the computing device and battery status data of the at least one other computing device; and
a processor configured to: (a) identify the at least one other computing device as being coupled to the power source based on the received identifier of the power cable, (b) group the computing device and the at least one other computing device into a charging group based on the received identifier of the power cable coupling the power source to the computing device and the at least one other computing device, and (c) throttle a power draw rate for charging the battery of the computing device according to the group charging policy and battery status data of the computing device and the at least one other computing device identified as being coupled to the power source in the charging group.

12. The system of claim 11, wherein the battery status data in the charging group comprises a respective battery charge state of the computing device and the at least one other computing device.

13. The system of claim 11, further comprising:
a charging cradle for connecting to the power source and for charging the battery of the computing device via the charging interface.

14. The system of claim 13, wherein the identifier is received by the computing device from the charging cradle.

15. The system of claim 14, wherein the charging cradle comprises:
a second memory for storing the identifier.

16. The system of claim 11, further comprising:
the power cable having a third memory storing the identifier and communicating the identifier to the computing device.

17. The system of claim 16, wherein the power cable comprises at least two connectors for coupling to charging cradles.

18. The system of claim 14, wherein the charging cradle comprises:
a processor configured to retrieve the identifier from the power cable.

19. The system of claim 11, wherein the processor reduces the power draw rate for charging the battery of the computing device.

20. The system of claim 11, wherein the processor maximizes the power draw rate for charging the battery of the computing device.

21. A charging cradle comprising:
a power adapter interface configured to connect to a power cable connected to a power source;
at least one charging interface, the at least one charging interface configured to connect to a computing device of a plurality of computing devices for charging a battery of the computing device;
a memory configured to store an identifier of the power cable that connects the power source to the power adapter interface of the cradle; and
a processor configured to communicate the identifier of the power cable to each computing device in the plurality of computing devices, wherein at least some of the plurality of computing devices are grouped into a charging group based on the identifier of the power cable.

22. The charging cradle of claim 21, wherein the processor is configured to interrogate a memory of the power cable to obtain the identifier.

* * * * *